US006808826B2

(12) United States Patent
Kim et al.

(10) Patent No.: US 6,808,826 B2
(45) Date of Patent: Oct. 26, 2004

(54) BLUE ELECTROLUMINESCENCE COMPOUND FOR AN ORGANIC ELECTROLUMINESCENCE DEVICE AND THE ORGANIC ELECTROLUMINESCENCE DEVICE USING THE SAME

(75) Inventors: Sung Han Kim, Seoul (KR); Han Sung Yu, Anyang (KR); Soon Ki Kwon, Chinju (KR); Yun Hi Kim, Chinju (KR); Dong Cheol Shin, Gyeongsangnam-do (KR); Hyun Wook Lee, Gyeongsangnam-do (KR); Hyun Cheol Jeong, Gyeongsangnam-do (KR)

(73) Assignee: Samsung SDI Co., Ltd., Suwon-si (KR)

( * ) Notice: Subject to any disclaimer, the term of this patent is extended or adjusted under 35 U.S.C. 154(b) by 140 days.

(21) Appl. No.: 09/862,449

(22) Filed: May 23, 2001

(65) Prior Publication Data

US 2002/0055013 A1 May 9, 2002

(30) Foreign Application Priority Data

Oct. 17, 2000 (KR) ....................................... 2000-60968

(51) Int. Cl.[7] ........................... B32B 19/00; B32B 9/00; H01J 29/82; H01J 1/62; C07F 7/21; C07F 7/04; C09K 11/06

(52) U.S. Cl. .................. 428/690; 428/917; 252/301.16; 313/504; 556/431; 556/432; 556/456

(58) Field of Search ................................ 428/690, 917; 252/301.16; 313/504; 556/431, 432, 456

(56) References Cited

U.S. PATENT DOCUMENTS 5,763,636 A * 6/1998 Kreuder et al. ............... 528/46
5,840,217 A * 11/1998 Lupo et al. ................. 252/583
5,989,737 A * 11/1999 Xie et al. ................... 428/690
6,132,641 A * 10/2000 Rietz et al. ............ 262/301.16
6,211,369 B1 * 4/2001 Salbeck et al. ............... 546/18
6,310,231 B1 * 10/2001 Igarashi et al. ............. 556/489
6,361,884 B1 * 3/2002 Kreuder et al. ............. 428/690
6,461,748 B1 * 10/2002 Suzuki et al. ............... 428/690
6,558,819 B1 * 5/2003 Igarashi ...................... 428/690

OTHER PUBLICATIONS

Appl. Phys. Lett. 51 (12). Sep. 21, 1987, "Organic electroluminescent diodes," pp. 913–915.

* cited by examiner

*Primary Examiner*—Camie S. Thompson
(74) *Attorney, Agent, or Firm*—Staas & Halsey LLP

(57) ABSTRACT

A blue electroluminescence compound for an electroluminescence display device comprising a spirobifluorene or triarylsilylphenyl group and a display device using such a blue electroluminescence compound, thereby improving a light emitting efficiency and brightness of the electroluminescence display device.

10 Claims, No Drawings

BLUE ELECTROLUMINESCENCE COMPOUND FOR AN ORGANIC ELECTROLUMINESCENCE DEVICE AND THE ORGANIC ELECTROLUMINESCENCE DEVICE USING THE SAME

CROSS REFERENCE TO RELATED APPLICATIONS

This application claims the benefit of Korean Patent Application No. 2000-60968, filed on Oct. 17, 2000, under 35 U.S.C. §119, the entirety of which is hereby incorporated by reference.

BACKGROUND OF THE INVENTION

1. Field of the Invention

The present invention relates to a blue electroluminescence compound and an organic electroluminescence display device, and more particularly, to a blue electroluminescence compound having improved light emitting efficiency and brightness and the organic electroluminescence display device using the same.

2. Description of Related Art

There is need to develop a display device having high performance according to the advancement of the information-communication industry. This display device is divided into two kinds, a light emitting type and a non-light emitting type. There are a cathode ray tube (CRT), an electroluminescence display (EL), a light emitting diode (LED), and a plasma display panel (PDP) as a light emitting type. Also, there is liquid crystal display (LCD) as a non-light emitting type.

The light emitting type display device and the non-light emitting type display device have basic characteristics of operating-voltage, consumption power, brightness, contrast, response time, life span and indication color. But, the liquid crystal display used frequently has problems of late response time, low contrast, and dependence of visual angle, etc.

It is difficult to apply a light emitting diode for an electroluminescence display device because the light emitting diode uses inorganic materials having mainly a crystal type. Also, in case of the electroluminescence display device using the inorganic materials, it has problems in that it needs 200 V of an operating-voltage and its production cost is high. But the display device using the light emitting diode has a rapid response time, and a good brightness, and is self-light emitting type without requiring a back light. Accordingly, it is hopeful that the display device using the light emitting diode will lead to advanced next-generation devices.

The electroluminescence display device is divided into an organic electroluminescence display device and an inorganic electroluminescence display device according to the material for forming the light emitting layer.

The organic electroluminescence display device is better with regard to brightness, operating-voltage and response time than the inorganic electroluminescence display device, and has a benefit of multi-colorization because the organic electroluminescence display device is a self-light emitting device which emits light by being electrically excited.

Also, this device has excellent properties of high brightness, rapid response time, wide visual angle, and multi-color emitting as a thin type because of the conductive device emitting in a low voltage direct current of a few volts.

The organic electroluminescence display device can be applied to a full color flat display.

The conventional organic electroluminescence display device has an anode on the upper portion of the substrate, and a hole transport layer, a light emitting layer, and an electron transport layer formed in this order on the upper portion of the anode. The hole transport layer, the light emitting layer and electron transport layer are made of an organic thin film consisting of organic compounds.

The operating method of the organic electroluminescence display device having the structure as cited above is described as below.

A hole injected from the anode is transferred to the light emitting layer via the hole transport layer when a voltage is provided between the anode and the cathode. While the electron is injected into the light emitting layer via the hole transport layer from the cathode, an exciton is produced by recombining carriers with each other in the region of the light emitting layer. This exciton is changed into a ground state from an excited state, a fluorescence molecule of the light emitting layer is emitted due to a change of the state, and an image is formed.

On the other hand, the Eastman Kodak company has developed an organic electroluminescence display device using a low molecule aromatic diamine and aluminium complex as the material for forming the light emitting layer in 1987 (Appl. Phys. Lett. 51, 913, 1987).

Diphenylanthracene, tetraphenylbutadiene, and distilylbenzene have been developed as the blue electroluminescence material, but it is known that these compounds are crystallized due to the poor stability of the thin film.

Idemitsu Company has developed a diphenyldistillyl group having an improved thin film stability because the phenyl group prevents the crystallization of the compounds (H. Tokilin, H. Higashi, C. Hosokawa, EP 388, 768 (1990)), and Kyushou University has developed a distilylanthracene derivative having an improved thin film stability by having the electron withdrawing group and the electron donating group (Pro. SPIE, 1910, 180 (1993)).

However, because the above electroluminescence compounds have a lower light emitting efficiency than other conventional electroluminescence compounds and there is need to develop the stability of the thin film of the display device, it is required to develop new blue electroluminescence compounds.

SUMMARY OF THE INVENTION

To overcome the problems described above, it is an object of the present invention to provide a blue electroluminescence compound comprising a spirobifluorene having excellent light emitting efficiency and good brightness.

Additional objects and advantages of the invention will be set forth in part in the description which follows and, in part, will be obvious from the description, or may be learned by practice of the invention.

The above and other objects of the present invention are further achieved by providing a blue electroluminescence compound comprising a triarylsilphenyl group.

The above and other objects of the present invention may also be achieved by providing an organic electroluminescence display device using one of the blue electroluminescence compounds provided above.

DETAILED DESCRIPTION OF PREFFERED EMBODIMENTS

Reference will now be made in detail to preferred embodiments of the present invention.

The present invention provides a blue electroluminescence compound represented by the following formula 1 or 4, and an organic electroluminescence display device using the same.

formula 1

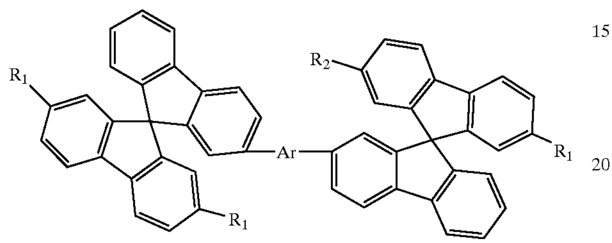

wherein, the Ar is a functional group selected from the group consisting of an aryl group having 6 to 20 carbons, an aryl group of 6 to 20 carbons having a 1 to 20 alkyl functional group, and an aryl group of 6 to 20 carbons having a 1 to 20 alkoxy group, and $R_1$ and $R_2$ are respectively a functional group selected from the group consisting of an alkyl group having 1 to 20 carbons, an aryl group of 6 to 20 carbons having an alkyl group of 1 to 20 carbons, and an aryl group of 6 to 20 carbons having an alkoxy group of 1 to 20 carbons.

formula 4

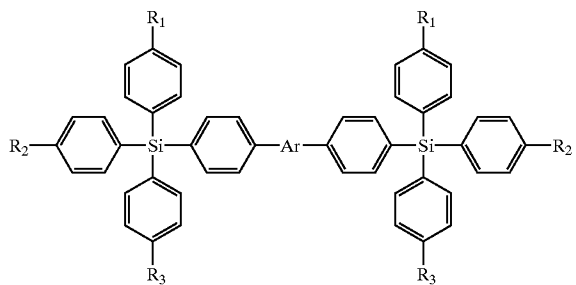

wherein, the Ar is a functional group selected from the group consisting of an aryl group having 6 to 20 carbons, an aryl group of 6 to 20 carbons having an alkyl group of 1 to 20 carbons, and an aryl group of 6 to 20 carbons having an alkoxy group of 1 to 20 carbons, and the $R_1$, $R_2$, and $R_3$ are respectively a functional group selected from the group consisting of H, an alkyl group of 1 to 20 carbons, an aryl group of 6 to 20 carbons having an alkyl group of 1 to 20 carbons, and an aryl group of 6 to 20 carbons having an alkoxy group of 1 to 20 carbons.

A blue electroluminescence compound represented in the above formula 1 comprises a spirobifluorene group in the end of the molecule. Here, the spirobifluorene group plays a role in preventing π-stacking with an adjacent compound. When preventing the π-stacking, excitons can not interact with each other. As the result, it is possible to prevent a drop in the light emitting efficiency due to the above reason.

Also, spirobifluorene groups are located perpendicular to each other, anthracene located on the center of the molecule and spirobifluorene located on both ends of the molecule are hindered sterically, and each of the anthracene and the spirobifluorene is distorted. As the result, due to the above reason, a crystallization is prevented and a stability of the thin film is extremely increased.

The Ar in the formula 1 may be represented in a following formula 2, and $R_1$ and $R_2$ may be t-butyl.

formula 2

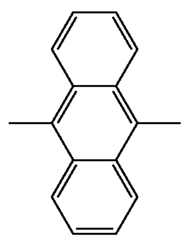

A preferable compound for the compound represented by the formula 1 is represented in a following formula 3.

formula 3

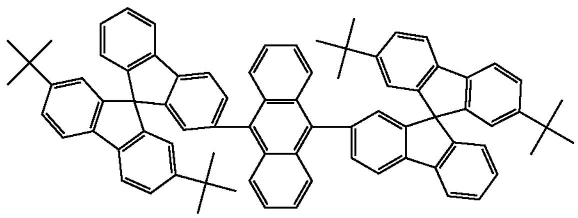

On the other hand, a blue electroluminescence compound represented in the formula 4 comprises a triarylsilylphenyl group at the end of the structure of the molecule. Also, the triarylsilylphenyl group plays a role in preventing π-stacking with adjacent compounds. When preventing π-stacking, the excitons can not interact with each other and it is possible to prevent a drop in the light emitting efficiency.

Particularly, the triarylsilphenyl group is distorted due to the steric hindrance of a four-phenyl group.

And, as the compound of the formula 4 does have an alkyl group, the stability of the display device is largely increased.

The Ar in the formula 4 may be represented in the following formula 2, and $R_1$, $R_2$ and $R_3$ are all hydrogen (H).

formula 2

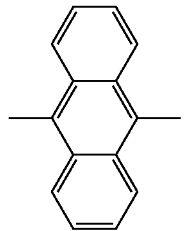

A preferable compound for the compound represented by the formula 4 can be represented in the following formula 5.

formula 5

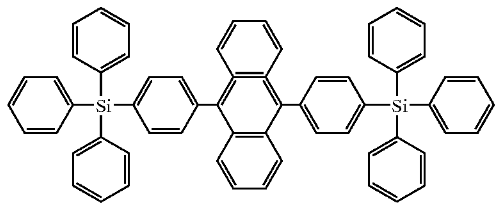

Also, the present invention provides the organic electroluminescence display device comprising an organic layer between a pair of electrodes. As the device uses the compounds represented in the formula 1 or 4 as an organic layer, this organic layer forms a thin film such as a light emitting layer. Thus, the light emitting efficiency and the brightness of the device in the present invention are improved more than in the conventional art.

Hereinafter, a method of preparing the organic electroluminescence display device according to an embodiment of the present invention will be described.

Firstly, a material for an anode electrode is coated on an upper portion of a substrate. The substrate used in the conventional organic electroluminescence device is used, and may be a glass substrate or a transparent plastic substrate.

One of indium tin oxide (ITO), indium oxide ($SnO_2$), zinc oxide (ZnO), etc., may be used as the anode electrode, for example.

A hole transport layer (HTL) is formed on the upper portion of the anode electrode by vacuum-depositing or spin-coating a material for forming a hole transport layer. The material for the hole transport layer is not limited to a particular material, but, it may be, for example, that N,N'-bis(3-methylphenyl)-N,N'-diphenyl-4,4'-diamine (TPD), or N,N'-di(naphthalene-1-yl)-N,N'-diphenyl-benzidene (-NPD) are used as the hole transport layer.

And then, the light emitting layer is formed on the upper portion of the hole transport layer by vacuum-depositing a light emitting material comprising the light emitting material of the formula 1 or 4. Sequentially, the organic electroluminescence display device is prepared by forming the cathode by vacuum-depositing a metal for forming the cathode on the upper portion of the light emitting layer. The metal for the cathode is one of Li, Al, Al—Li, Ca, Mg—In, and Mg—Ag.

The electron transport layer can be formed before forming the cathode on the upper portion of the light emitting layer. A conventional material for an electron transport layer is used as the electron transport layer.

The organic electroluminescence display device of the present invention can have more interlayer(s) between two layers selected from the group consisting of an anode, a hole transport layer, an emitting layer, an electron transport layer, and a cathode. Additionally, a hole injection layer can be formed between the anode and the hole transport layer. This hole transport layer helps inject the holes into the hole transport layer from the anode, simultaneously, and improves the attachment of the hole transport layer (for example, α-NPD) and the anode (for example, ITO).

The material for the hole injection layer is not limited to a particular material, but, may be one of CuPc, m-MTDATA, and I-TNATA, for example.

The organic electroluminescence display device can be prepared in the order of anode/hole transport layer/light emitting layer/electron transport layer/cathode, or, can be prepared in the reverse order.

Synthetic Example

Preparation of the Compound of the Formula 3

As represented in the following formula reaction 1, firstly, carbon tetra chloride ($CCl_4$) is slowly added to t-butylbenzene, and then, 4-t-butylbenzenebromide (A) is prepared by the reaction with bromide. The yield is 80%.

The 4-t-butylbenzenebromide (A) is dripped into a mixture of Mg and THF, is heated, and then Grignard reagents are prepared. After nickel chloride ($NiCl_2$) is added to the Grignard reagents, this mixture is refluxed for 8 hours, and then, 4,4'-di-t-butylphenylene (B) is produced. The yield is 80%.

The compound B is added to carbon tetra chloride ($CCl_4$), and 4,4'-di-t-butyl-2-bromodiphenylene (C) is prepared by adding bromide to the mixture of compound B and carbon tetra chloride. The yield is 80%.

The compound (C) is dripped into the mixture of Mg and diethylether, is heated, and then, the Grignard reagents are prepared. After 2-bromofluorene is added to the Grignard reagents, the mixture is reacted for 4 hours, and then, a compound (D) is produced. The yield is 60%.

The compound (D) is added to acetic acid and is refluxed for 3 hours. A compound (E) is produced. The yield is 90%.

After 9,10-dibromoanthracene is dissolved in diethylether dried by using Na, n-butyllithium of 2 equivalents is added to the mixture at −40° C. The reaction mixture is stirred for 1 hour at room temperature, and then cooled to −70° C. After trimethylborate is added to the cooled mixture, the mixture is stirred for 10 hours at room temperature. The reaction mixture is mixed in a solution of ice and sulfuric acid (4 N $H_2SO_4$), stirred for 2 hours, and then a product (F) is produced. The yield is 20%.

The compound (E) and product (F) of 2 equivalents are dissolved in the THF, and the tetra kis(triphenylphosphine) palladium of 0.6 to 1 mol % and 2.5 equivalents $K_2CO_3$ of 2 M are added to the mixture. This reaction mixture is refluxed for 24 hours and the compound of the formula 3 is produced. The yield is 40%.

reaction 1

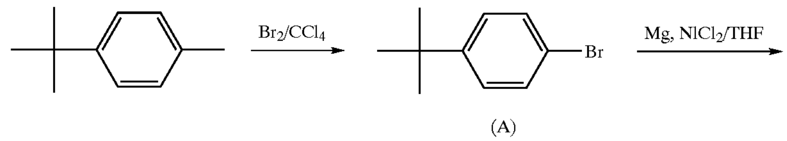

-continued

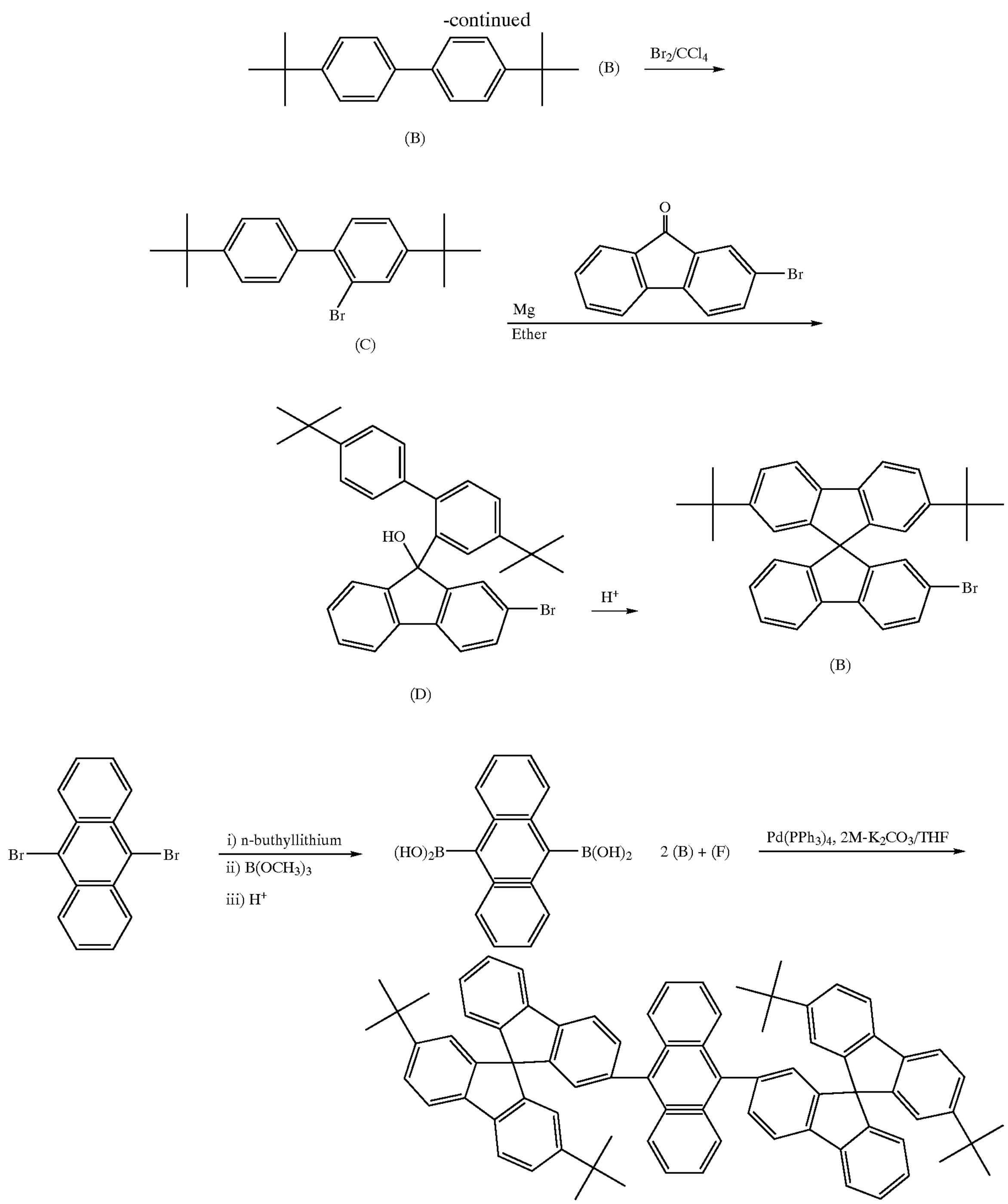

Preparation of the Compound of the Formula 5

As represented in the following formula reaction 2, firstly, after 1,4-dibromobenzene is dissolved in diethylether dried by using Na, n-butyllithium of 1 equivalent is slowly added to the mixture at −40° C. The reaction mixture is stirred for 1 hour at room temperature and is cooled to −40° C. Triphenylsilylchloride is added to the cooled mixture and is stirred for 4 hours at room temperature. A compound (A) is produced. The yield is 95%.

After 9,10-dibromoanthracene is dissolved in diethylether dried by using Na, n-butyllithium of 2 equivalents are slowly added to the mixture at −40° C. After the reaction mixture is stirred for 1 hour at room temperature, the reaction mixture is cooled to −70° C., and trimethylborate of 5 equivalents is added to the cooled mixture. The mixture is stirred for 10 hours at room temperature. The reaction mixture is dissolved in a solution of ice and sulfuric acid (4 N $H_2SO_4$) and is stirred for 2 hours. A product (B) is produced. The yield is 20%, After the product (B) and the compound (A) of 2 equivalents are dissolved in THF, tetra kis(triphenylphosphine) palladium of 0.6 to 1 mol % and 2.5 equivalents $K_2CO_3$ of 2 M are added to the mixture. The reaction mixture is refluxed for 24 hours and then the compound of the formula 5 is produced. The yield is 80%.

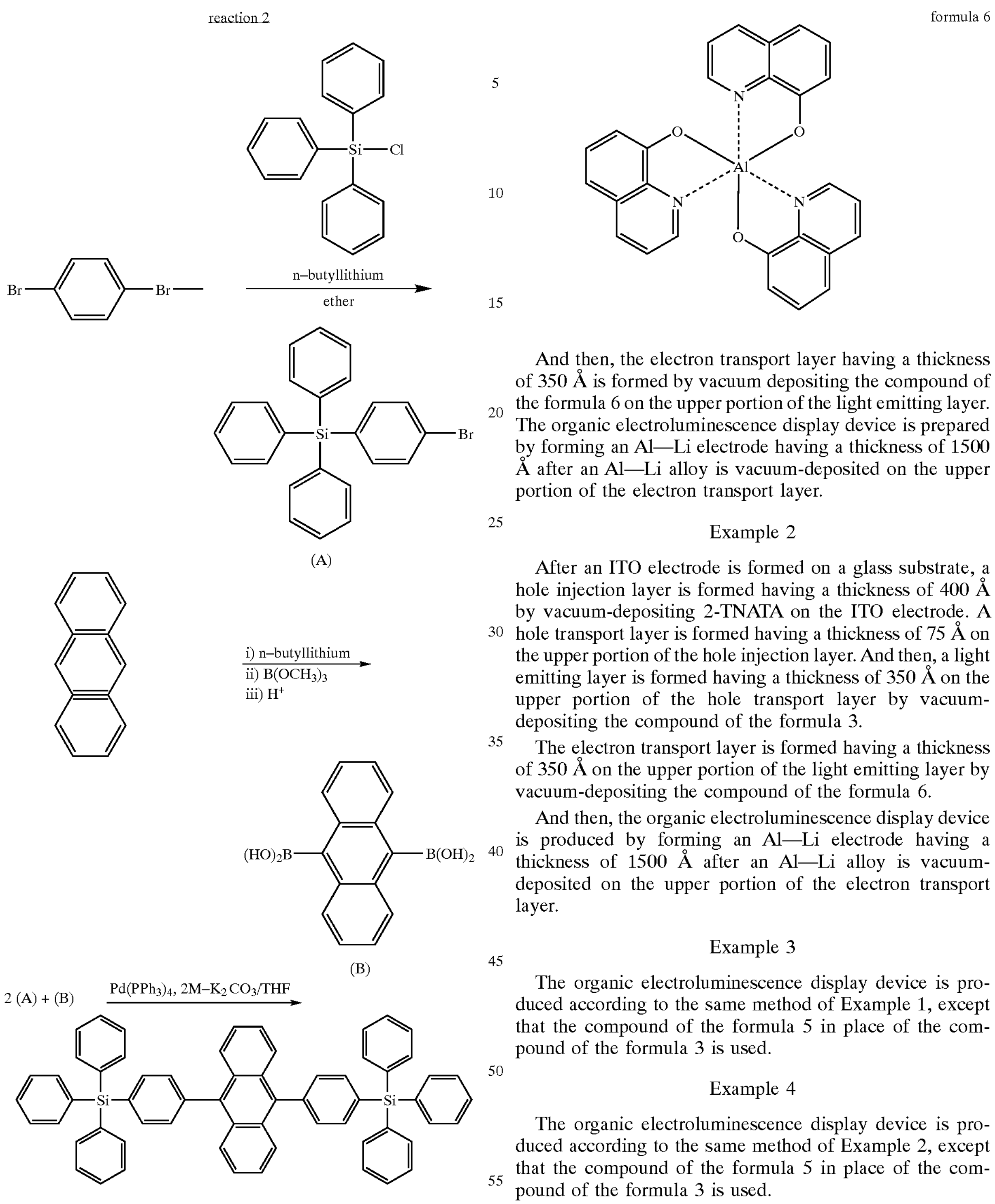

Preparation of the Electroluminescence Display Device

Example 1

After an ITO electrode is formed on a glass substrate, a hole transport layer is formed having a thickness of 500 Å by vacuum-depositing N,N'-bis(3-methylphenyl)-N,N'-diphenyl-4,4'-diamine (TPD) on the ITO electrode.

And then, a light emitting layer having a thickness of 280 Å is formed by vacuum-depositing a compound of the formula 3 on the hole transport layer.

And then, the electron transport layer having a thickness of 350 Å is formed by vacuum depositing the compound of the formula 6 on the upper portion of the light emitting layer. The organic electroluminescence display device is prepared by forming an Al—Li electrode having a thickness of 1500 Å after an Al—Li alloy is vacuum-deposited on the upper portion of the electron transport layer.

Example 2

After an ITO electrode is formed on a glass substrate, a hole injection layer is formed having a thickness of 400 Å by vacuum-depositing 2-TNATA on the ITO electrode. A hole transport layer is formed having a thickness of 75 Å on the upper portion of the hole injection layer. And then, a light emitting layer is formed having a thickness of 350 Å on the upper portion of the hole transport layer by vacuum-depositing the compound of the formula 3.

The electron transport layer is formed having a thickness of 350 Å on the upper portion of the light emitting layer by vacuum-depositing the compound of the formula 6.

And then, the organic electroluminescence display device is produced by forming an Al—Li electrode having a thickness of 1500 Å after an Al—Li alloy is vacuum-deposited on the upper portion of the electron transport layer.

Example 3

The organic electroluminescence display device is produced according to the same method of Example 1, except that the compound of the formula 5 in place of the compound of the formula 3 is used.

Example 4

The organic electroluminescence display device is produced according to the same method of Example 2, except that the compound of the formula 5 in place of the compound of the formula 3 is used.

Example 5

After an ITO electrode is formed on a glass substrate, CuPc is vacuum deposited having a thickness of 200 Å as a hole injection layer and then a hole transport layer is formed having a thickness of 500 Å on the hole injection layer by vacuum-depositing N,N'-bis(3-methylphenyl)-N,N'-diphenyl-4,4'-diamine (TPD) on the ITO electrode.

And then, a light emitting layer having a thickness of 280 Å is formed by vacuum-depositing the compound of the formula 5 on the upper portion of the hole transport layer.

And an electron transport layer having a thickness of 350 Å is formed by vacuum-depositing the compound of the formula 6 on the upper portion of the light emitting layer. The organic electroluminescence display device is produced by forming an Al—Li electrode having a thickness of 1500 Å after vacuum-depositing an Al—Li alloy on the upper portion of the electron transport layer.

Example 6

After an ITO electrode is formed on a glass substrate, a hole injection layer is formed having a thickness of 200 Å by vacuum-depositing CuPc on the ITO electrode.

A hole transport layer is formed having a thickness of 75 Å by vacuum-depositing α-NPD on the upper portion of the hole injection layer. And then, a light emitting layer is formed in thickness of 350 Å by vacuum-depositing the compound of the formula 6 on the upper portion of the hole transport layer.

The electron transport layer is formed having a thickness of 350 Å by vacuum-depositing the compound of the formula 5 on the light emitting layer.

And then, the organic electroluminescence display device is produced by an Al—Li electrode having a thickness of 1500 Å by vacuum-depositing an Al—Li alloy on the upper portion of the electron transport layer.

Performance of the Electroluminescence Display Device

When the blue electroluminescence compounds of the embodiments of the present invention are used in the display device, light emitting diode I-V properties are measured under an electric field. The turn-on voltage is 5 V, the color purity is (0.14, 0.09) and the efficiency is 3 cd/A.

As described herein before, according to the embodiments of the present invention, it is possible to provide the electroluminescence compounds having excellent light emitting efficiency and good brightness.

While the invention has been particularly shown and described with reference to a preferred embodiment thereof, it will be understood by those skilled in the art that the foregoing and other changes in form and details may be made therein without departing from the spirit and scope of the invention.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A blue electroluminescence compound for an electroluminescence display device comprising a spirobifluorene represented in a following formula 1:

formula 1

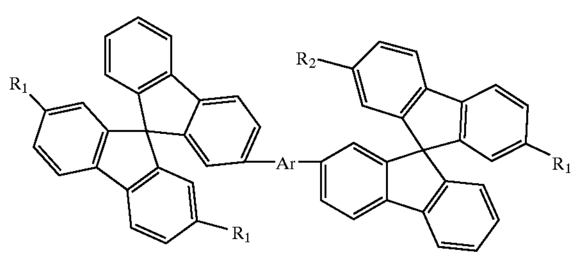

wherein the Ar is a functional group selected from the group consisting of an aryl group having 6 to 20 carbons, an aryl group of 6 to 20 carbons having a 1 to 20 alkyl functional group, and an aryl group of 6 to 20 carbons having a 1 to 20 alkoxy group, and the $R_1$ and $R_2$ each is a functional group selected from the group consisting of an alkyl group having 1 to 20 carbons, an aryl group of 6 to 20 carbons having an alkyl group of 1 to 20 carbons, and an aryl group of 6 to 20 carbons having an alkoxy group of 1 to 20 carbons.

2. The blue electroluminescence compound of claim 1, wherein the Ar is a functional group selected from the group consisting of anthracene, naphthalene, and a phenyl group in the formula 1.

3. The blue electroluminescence compound of claim 1, wherein each of the $R_1$ and $R_2$ is a t-butyl group in the formula 1.

4. The blue electroluminescence compound of claim 1, wherein the electroluminescence compound is a compound represented in a following formula 3:

formula 3

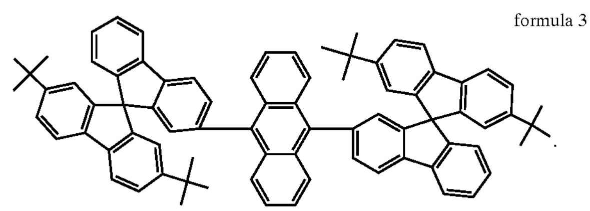

5. A blue electroluminescence compound for an electroluminescence display device comprising triarylsilphenyl represented in a following formula 4:

formula 4

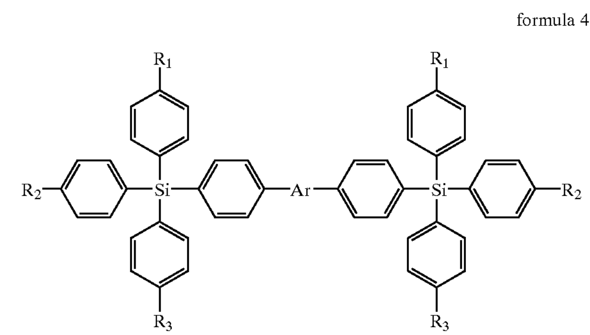

wherein the Ar is a functional group selected from the group consisting of an aryl group having 6 to 20 carbons, an aryl group of 6 to 20 carbons having an alkyl group of 1 to 20 carbons, and an aryl group of 6 to 20 carbons having an alkoxy group of 1 to 20 carbons, and the $R_1$, $R_2$, and $R_3$ each is a functional group selected from the group consisting of H, an alkyl group of 1 to 20 carbons, an aryl group of 6 to 20 carbons having an alkyl group of 1 to 20 carbons, and an aryl group of 6 to 20 carbons having an alkoxy group of 1 to 20 carbons.

6. The blue electroluminescence compound of claim 5, wherein the Ar is one of anthracene and naphthalene.

7. The blue electroluminescence compound of claim 5, wherein the blue electroluminescence compound is a compound represented in a following formula 5:

formula 5

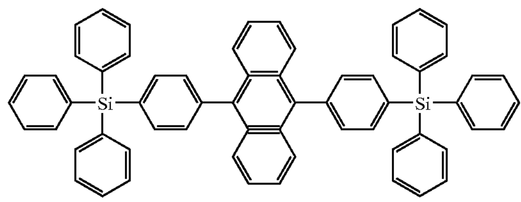

8. An organic electroluminescence display device comprising:

an organic layer between a pair of electrodes, wherein the organic layer comprises a compound represented in a following formula 1 or 4:

formula 1

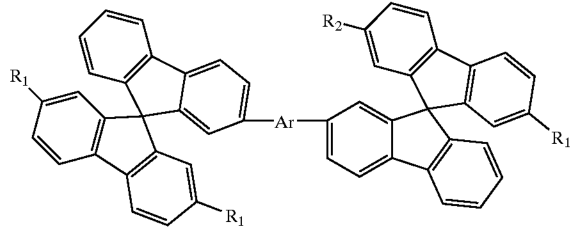

wherein an Ar is a functional group selected from the group consisting of an aryl group having 6 to 20 carbons, an aryl group of 6 to 20 carbons having a 1 to 20 alkyl functional group, and an aryl group of 6 to 20 carbons having a 1 to 20 alkoxy group, and the $R_1$ and $R_2$ each is a functional group selected from the group consisting of an alkyl group having 1 to 20 carbons, an aryl group of 6 to 20 carbons having an alkyl group of 1 to 20 carbons, and an aryl group of 6 to 20 carbons having an alkoxy group of 1 to 20 carbons; and formula 4

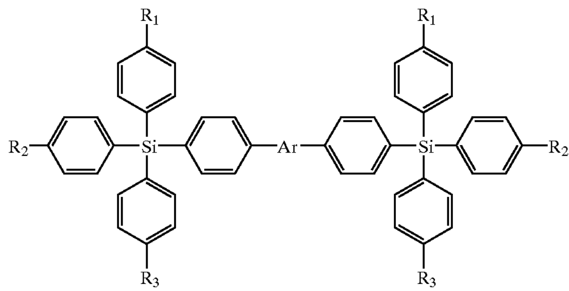

wherein the Ar is a functional group selected from the group consisting of an aryl group having 6 to 20 carbons, an aryl group of 6 to 20 carbons having an alkyl group of 1 to 20 carbons, and an aryl group of 6 to 20 carbons having an alkoxy group of 1 to 20 carbons, and the $R_1$, $R_2$, and $R_3$ each is a functional group selected from the group consisting of H, an alkyl group of 1 to 20 carbons, an aryl group of 6 to 20 carbons having an alkyl group of 1 to 20 carbons and an alkyl group of 6 to 20 carbons having an alkoxy group of 1 to 20 carbons.

9. The organic electroluminescence display device of claim 8, wherein the compound is a compound represented in a following formula 3:

formula 3

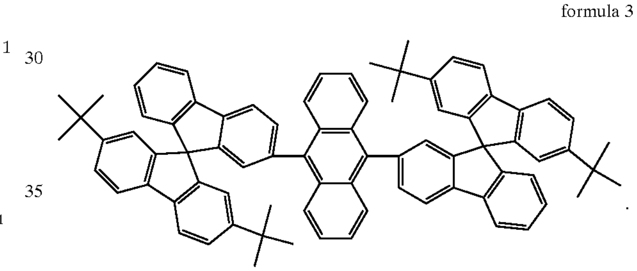

10. The organic electroluminescence display device of claim 8, wherein the compound is a compound represented in a following formula 5:

formula 5

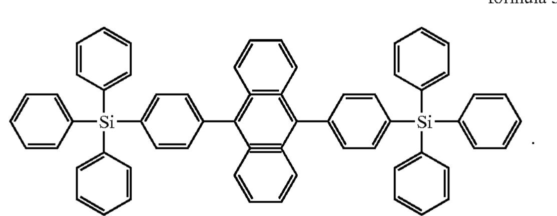

* * * * *